United States Patent
Hasegawa

(10) Patent No.: US 9,055,668 B2
(45) Date of Patent: Jun. 9, 2015

(54) METHOD OF FABRICATING A MULTI-PIECE BOARD

(75) Inventor: Yasushi Hasegawa, Ogaki (JP)

(73) Assignee: IBIDEN CO., LTD., Ogaki-shi (JP)

(*) Notice: Subject to any disclaimer, the term of this patent is extended or adjusted under 35 U.S.C. 154(b) by 722 days.

(21) Appl. No.: 13/291,167

(22) Filed: Nov. 8, 2011

(65) Prior Publication Data

US 2012/0047728 A1 Mar. 1, 2012

Related U.S. Application Data

(62) Division of application No. 12/499,311, filed on Jul. 8, 2009, now Pat. No. 8,698,004.

(30) Foreign Application Priority Data

Oct. 27, 2008 (JP) ................................. 2008-276169

(51) Int. Cl.
| | |
|---|---|
| *B23P 6/00* | (2006.01) |
| *H05K 3/00* | (2006.01) |
| *H05K 3/22* | (2006.01) |

(52) U.S. Cl.
CPC ......... *H05K 3/0097* (2013.01); *Y10T 29/49126* (2015.01); *H05K 3/0052* (2013.01); *H05K 3/225* (2013.01); *H05K 2201/10598* (2013.01); *H05K 2203/162* (2013.01)

(58) Field of Classification Search
CPC .............. H05K 3/0052; H05K 1/0269; H05K 2201/09845; H05K 2201/10598; H05K 3/0097; H05K 3/225; H05K 2203/162
USPC ............... 29/402.01, 402.03, 402.04, 402.05, 29/402.06, 402.08, 402.09, 402.11, 29/402.21, 830
See application file for complete search history.

(56) References Cited

U.S. PATENT DOCUMENTS

| | | | | |
|---|---|---|---|---|
| 3,765,076 A | * | 10/1973 | Brandt ............................. | 29/860 |
| 4,610,079 A | | 9/1986 | Abe et al. | |
| 5,032,896 A | | 7/1991 | Little et al. | |
| 5,196,652 A | | 3/1993 | Mikkelsen, Jr. et al. | |
| 5,263,868 A | * | 11/1993 | Renn et al. ...................... | 439/67 |
| 5,866,852 A | | 2/1999 | Benz et al. | |
| 6,481,098 B1 | * | 11/2002 | Lin Chen ........................ | 29/829 |
| 6,573,157 B1 | | 6/2003 | Sato | |
| 6,574,862 B1 | | 6/2003 | Choi et al. | |
| 6,611,050 B1 | | 8/2003 | Ference et al. | |

(Continued)

FOREIGN PATENT DOCUMENTS

| | | |
|---|---|---|
| JP | 64-048489 | 2/1989 |
| JP | 10-247656 | 9/1998 |
| JP | 2002-043702 | 2/2002 |
| JP | 2002-232089 | 8/2002 |
| JP | 2005-38953 | 2/2005 |
| JP | 2007-115855 | 5/2007 |
| TW | M292869 U | 6/2006 |
| TW | M292869 U * | 6/2006 |

*Primary Examiner* — Carl Arbes
(74) *Attorney, Agent, or Firm* — Oblon, McClelland, Maier & Neustadt, L.L.P.

(57) ABSTRACT

A fabrication method for a multi-piece board includes: checking whether pieces (printed wiring boards) are defect-free or not; forming a first recess in a joint portion between a defective piece and a frame; forming a first fitting portion at the frame by separating the defective piece; cutting out a defect-free piece having a second fitting portion from another board; forming a second recess in the second fitting portion; fitting the second fitting portion into the first fitting portion; flattening a joint portion; and filling an adhesive in a third recess which is formed by the first recess and the second recess, and curing the adhesive to adhere the frame and the defect-free piece.

20 Claims, 21 Drawing Sheets

(56) References Cited

U.S. PATENT DOCUMENTS

| | | |
|---|---|---|
| 6,717,245 B1 | 4/2004 | Kinsman et al. |
| 6,727,591 B2 | 4/2004 | Yanase et al. |
| 7,008,236 B2 * | 3/2006 | Wabiszczewicz ............... 439/65 |
| 7,143,492 B2 * | 12/2006 | Chen ........................ 29/402.08 |
| 7,286,370 B2 | 10/2007 | Ooyabu |
| 7,323,641 B2 | 1/2008 | Higuchi et al. |
| 7,559,138 B2 | 7/2009 | Sin |
| 8,572,839 B2 * | 11/2013 | Hasegawa ........................ 29/831 |
| 2004/0245012 A1 * | 12/2004 | Wabiszczewicz ............. 174/250 |
| 2005/0016897 A1 | 1/2005 | Cho et al. |
| 2006/0169486 A1 | 8/2006 | Funada et al. |

* cited by examiner

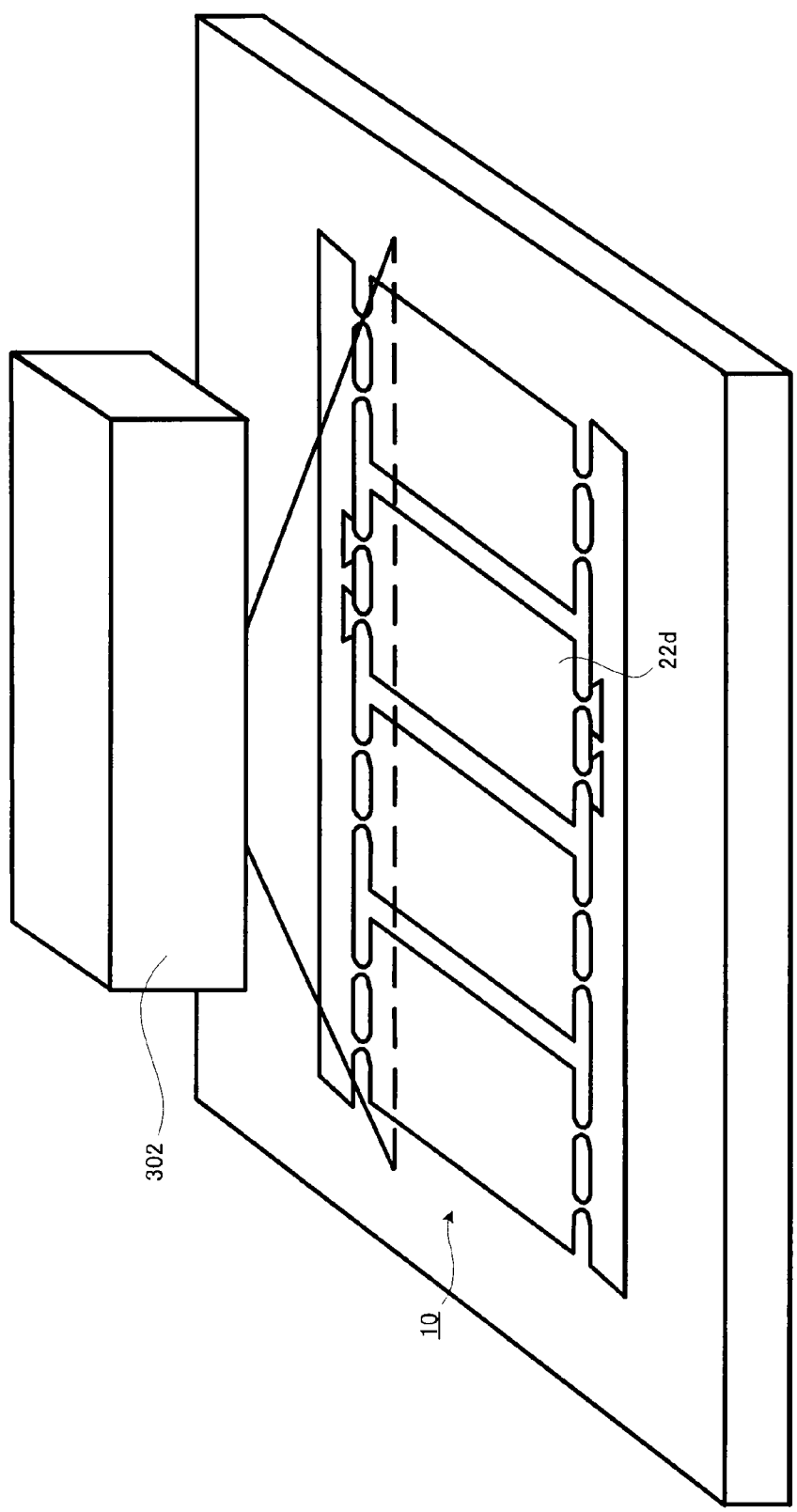

METHOD OF FABRICATING A MULTI-PIECE BOARD

CROSS REFERENCE TO RELATED APPLICATION

The present application is a divisional of and claims the benefit of priority to U.S. application Ser. No. 12/499,311, filed Jul. 8, 2009, which is based on and claims the benefits of priority to Japanese Patent Application No. 2008-276169, filed Oct. 27, 2008. The entire contents of these applications are incorporated herein by reference.

BACKGROUND OF THE INVENTION

1. Field of the Invention

The present invention relates to a multi-piece board having a frame and multi-piece parts each comprising a printed wiring board and a fabrication method thereof.

2. Descriptions of the Related Art

For example, Unexamined Japanese Patent Application KOKAI Publication No. H01-48489, Unexamined Japanese Patent Application KOKAI Publication No. 2002-43702, and Unexamined Japanese Patent Application KOKAI Publication No. 2002-232089 describe multi-piece boards. Those multi-piece boards each has a frame and multi-piece parts connected to the frame. When a multi-piece board includes a defective piece, a user cuts out the defective piece from the frame and attaches a good (defect-free) piece thereto instead.

The contents of Unexamined Japanese Patent Application KOKAI Publication No. H01-48489, Unexamined Japanese Patent Application KOKAI Publication No. 2002-43702, and Unexamined Japanese Patent Application KOKAI Publication No. 2002-232089 are herein incorporated in their entirety.

SUMMARY OF THE INVENTION

According to the first aspect of the invention, there is provided a fabrication method for a multi-piece board having a frame and multi-piece parts each having a printed wiring board and connected to the frame, the method includes: checking whether the pieces are good or not; forming a first recess in the defective piece and the frame; separating the defective piece from the frame; cutting out a good piece from another board; forming a second recess in the another board in a joint portion between good piece and the frame at a position corresponding to the first recess; fitting the good piece in such a way that the first recess is matching with the second recess; flattening a joint portion between the frame and the good piece; and filling an adhesive in a third recess which is formed by matching the first recess with the second recess, and curing the adhesive to adhere the frame and the good piece.

A multi-piece board according to the second aspect of the invention has a frame; and a piece adhered to the frame by an adhesive. A joint portion between the frame and the piece is flattened; and a first recess of the frame, which is formed at a joint portion where the frame is jointed with the multi-piece board, and a second recess of the multi-piece board, which is formed at a joint portion where the multi-piece board is jointed with the frame, form a third recess to be filled with the adhesive.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 15 is a diagram for explaining a step of checking the degree of flatness;

DETAILED DESCRIPTIONS OF THE PREFERRED EMBODIMENT

Figure 1:
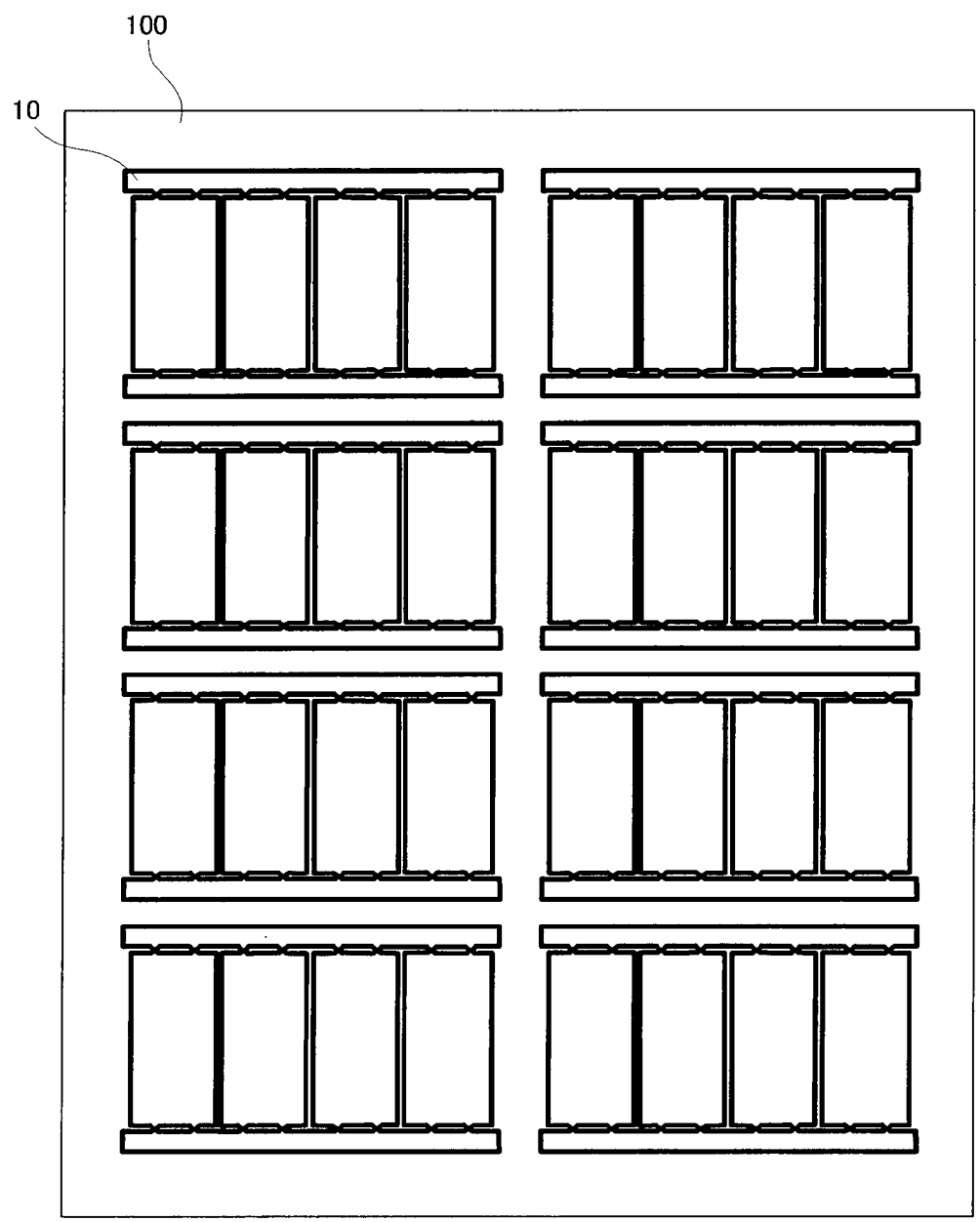
FIG. 1 is a plan view of a multi-piece board according to one embodiment of the present invention.

The embodiments will now be described with reference to the accompanying drawings, wherein like reference numerals designate corresponding or identical elements throughout the various drawings.

A fabrication method for a multi-piece board according to the embodiment is described.

Figure 2:
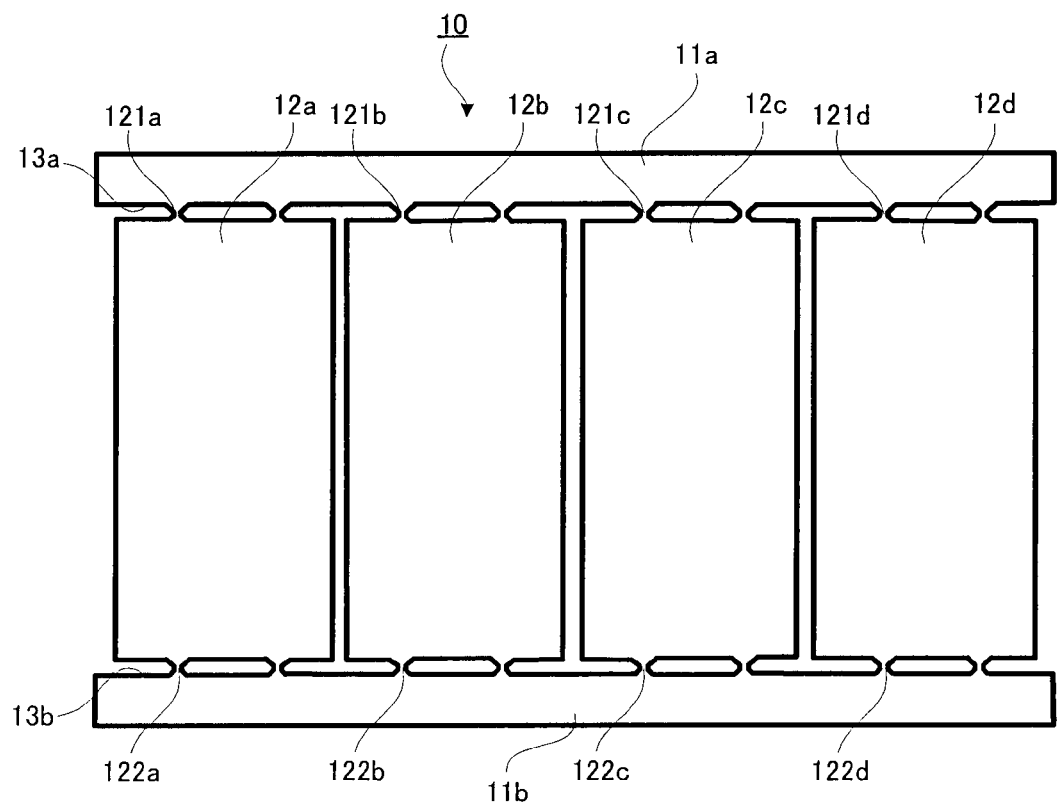
FIG. 2 is a partly enlarged diagram of the multi-piece board in FIG. 1.

A worker first prepares a predetermined number of multi-piece boards on a workpiece 100 as shown in FIG. 1. FIG. 2 shows one multi-piece board 10 of the multi-piece boards.

The multi-piece board 10 has frames 11a and 11b, pieces 12a, 12b, 12c and 12d.

The frames 11a and 11b are two long bar-like parts sandwiching the successive pieces 12a to 12d. It is to be noted that the shape of the frames 11a and 11b is not limited to the bar shape. The shape of the frames 11a and 11b is optional, and may be, for example, a parallelogram, circular or elliptical frame surrounding the pieces 12a to 12d. The frames 11a and 11b are formed of, for example, the same material as that for the pieces 12a to 12d. The material is not however essential, and the frames 11a and 11b may be formed of a material different from the material for the pieces 12a to 12d. For example, the frames 11a and 11b may be formed of an insulating material alone. The frames 11a and 11b are formed by, for example, a known photolithography technique or the like.

Each of the pieces 12a to 12d includes a printed wiring board. Specifically, each of the pieces 12a to 12d include a rectangular rigid printed wiring board. The printed wiring board includes circuits of an electronic device, for example. The pieces 12a to 12d can be fabricated by laminating a prepreg impregnated with an uncured epoxy resin, polyimide resin or phenolic resin or the like on a base, such as a glass cloth, an unwoven cloth of aramid fibers, or paper, using a general fabrication method for, for example, a multilayer printed wiring board. It is to be however noted that the structure of the pieces 12a to 12d is not limited to this particular type. Each of the pieces 12a to 12d may be a printed wiring board acquired by alternately laminating a wiring layer and an insulation layer on, for example, a ceramic base. Each of the pieces 12a to 12d is not limited to a rigid printed wiring board, and may be a flexible printed wiring board, a flex-rigid printed wiring board or the like. In addition, the shape of the pieces 12a to 12d is optional, and may be, for example, a parallelogram, circular or elliptical shape.

Slits 13a and 13b are formed between the frame 11a, 11b and the pieces 12a to 12d, excluding those portions of bridges 121a to 121d and 122a to 122d. That is, the frame 11a is connected to the pieces 12a, 12b, 12c and 12d by the bridges 121a, 121b, 121c and 121d, respectively, and the frame 11b is connected to the pieces 12a, 12b, 12c and 12d by the bridges 122a, 122b, 122c and 122d, respectively.

The multi-piece boards having the foregoing structure is fabricated on a single workpiece 100. As the outer shapes of the plurality of multi-piece boards fabricated on the single workpiece 100 are processed by an alignment router, each multi-piece board can be separated from the workpiece 100.

Subsequently, the worker carries out a series of processes illustrated in FIG. 3 on the multi-piece board 10.

The worker first checks electrification of each of the pieces 12a to 12d of the multi-piece board 10 (first board) in step S11. Then, the worker determines in step S12 whether the pieces 12a to 12d contains a defective piece. When it is determined in the electrification test that every piece is a good piece, the sequence of processes in FIG. 3 is terminated and the flow goes to a subsequent process such as an assembling process. When it is determined that any one of the pieces is a defective piece, on the other hand, the flow goes to step S13 to replace the defective piece with a good one. The following describes a case where the piece 12c is determined as a defective piece.

Figure 4:
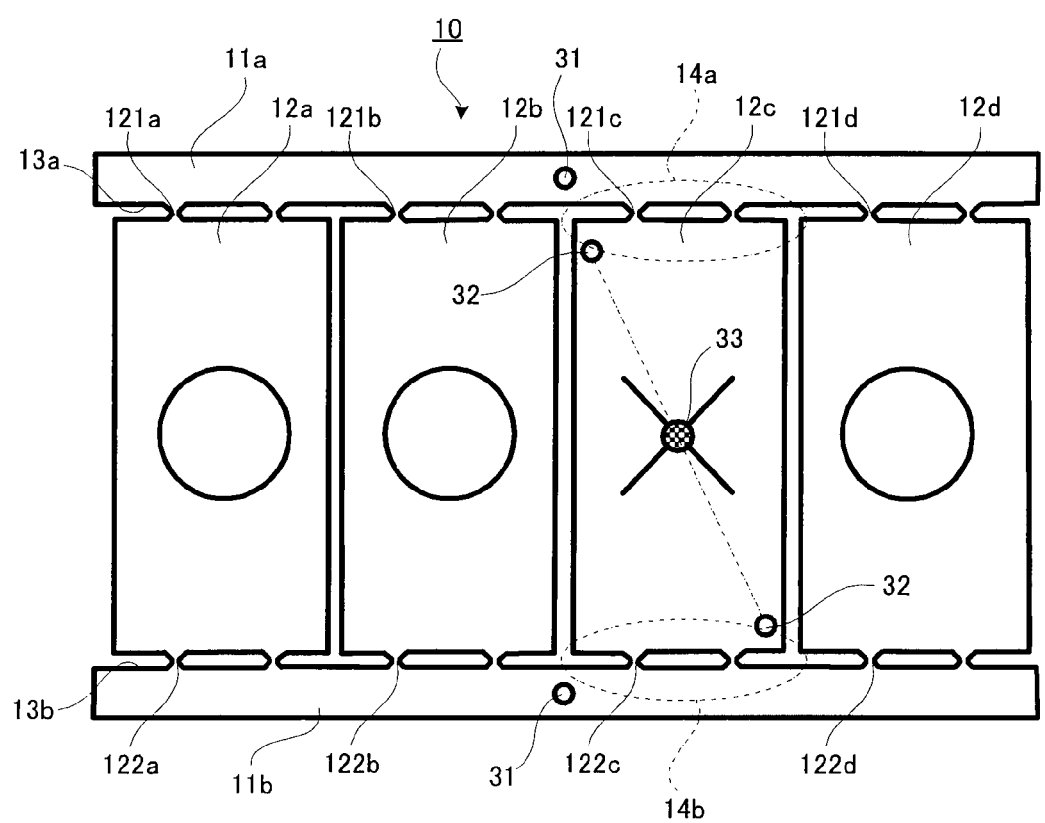
FIG. 4 is a diagram showing a multi-piece board (first board) secured by pins.
Figure 5A:
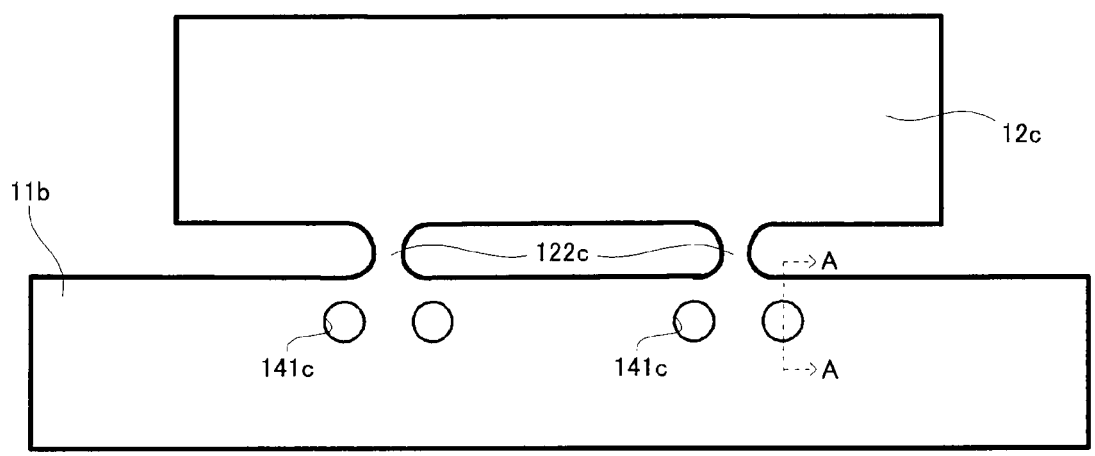
FIG. 5A is a diagram for explaining a step of forming an recess in the joint portion between a good piece and a frame.
Figure 5B:
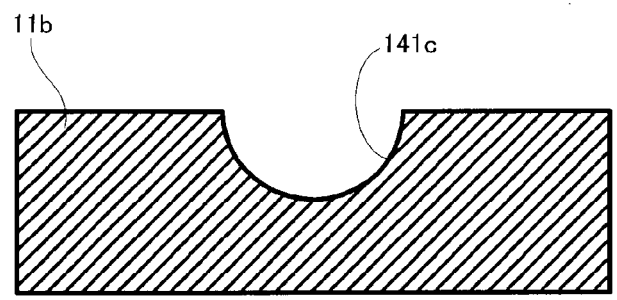
FIG. 5B is a cross-sectional view along line A-A in FIG. 5A.

In the next step S13, as shown in FIG. 4, the worker sets pins 31 in the frames 11a and 11b, and sets pins 32 in the piece 12c to secure the multi-piece board 10. Then, the alignment position of the piece 12c is scanned by an alignment router machine to acquire a geometric barycenter 33. Then, with the barycenter 33 being taken a reference or according to the distance from the barycenter 33, a predetermined number of non-penetrating recesses 141c (recesses) dented with respect to the board surface are formed in each joint portion 14a, 14b between the piece 12c and the frame 11a, 11b by, for example, a router bit, a drill, a laser or the like as shown in FIG. 5A and FIG. 5B (cross-sectional view along line A-A in FIG. 5A). While FIGS. 5A and 5B show only the frame 11b side for the sake of descriptive convenience, the same is true of the frame 11a side.

Figure 6A:
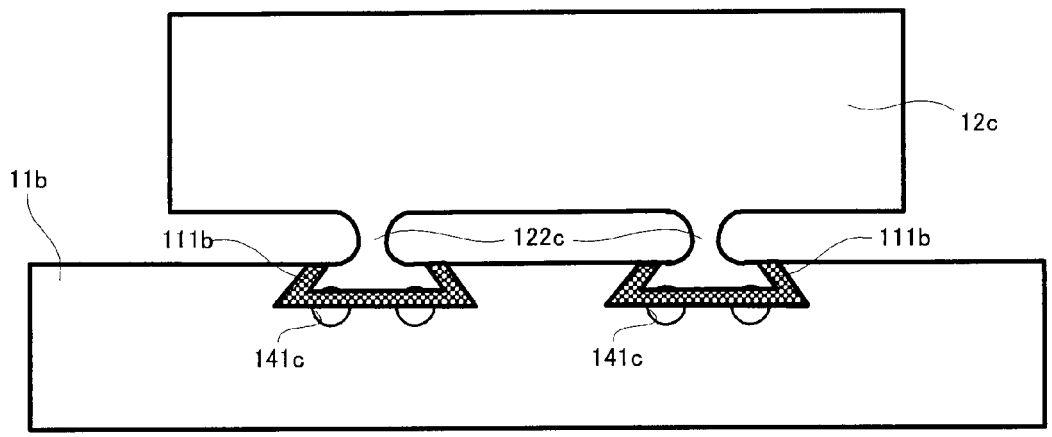
FIG. 6A is a diagram for explaining a step of forming a nick in the joint portion between a good piece and a frame.
Figure 6B:
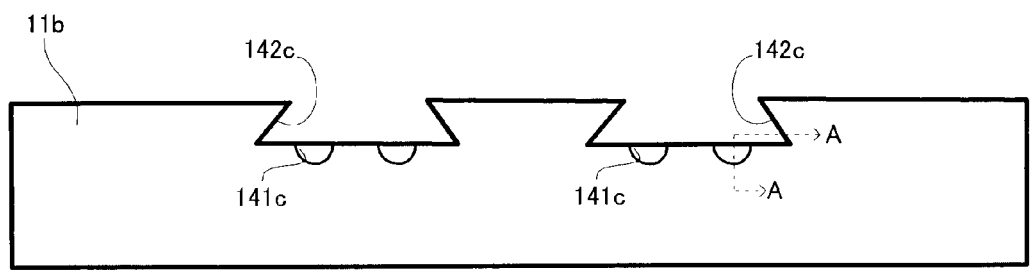
FIG. 6B is a diagram showing the frame cut away from a defective piece.
Figure 6C:
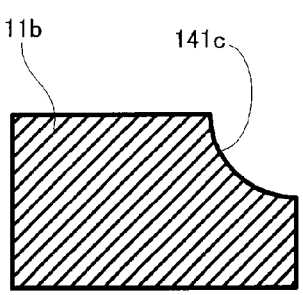
FIG. 6C is a cross-sectional view along line A-A in FIG. 6B.

Subsequently, the worker nicks the joint portions 14a, 14b (FIG. 4) using the alignment router. The cutting with the alignment router needs a cutting margin (extra length). That is, as shown in FIG. 6A, the cutting with the alignment router takes away the material of a nick portion 111b. Because the piece 12c (defective piece) is not used later, the worker finishes the multi-piece board 10 to predetermined outer sizes (design values) with the cutting with higher priority given to the frames 11a, 11b. Then, the worker separates the piece 12c from the frames 11a, 11b. As a result, as shown in FIG. 6B, recesses 142c (claw receiving portions) dented with respect to the side face of the frame 11a, 11b, more specifically that side face of the frame 11a, 11b which faces the piece 12c, are formed in the joint portion 14a, 14b of the frame 11a, 11b. The recess 142c has a trapezoidal shape spreading toward the frame 11a, 11b from the piece 12c side. As shown in FIG. 6C (cross-sectional view along line A-A in FIG. 6B), a predetermined of quarter-spherical recesses 141c, for example, two recesses 141c per recess 142c, remain at a portion adjoining the recess 142c. While FIGS. 6A to 6C show only the frame 11b side for the sake of descriptive convenience, the same is true of the frame 11a side.

Figure 7:
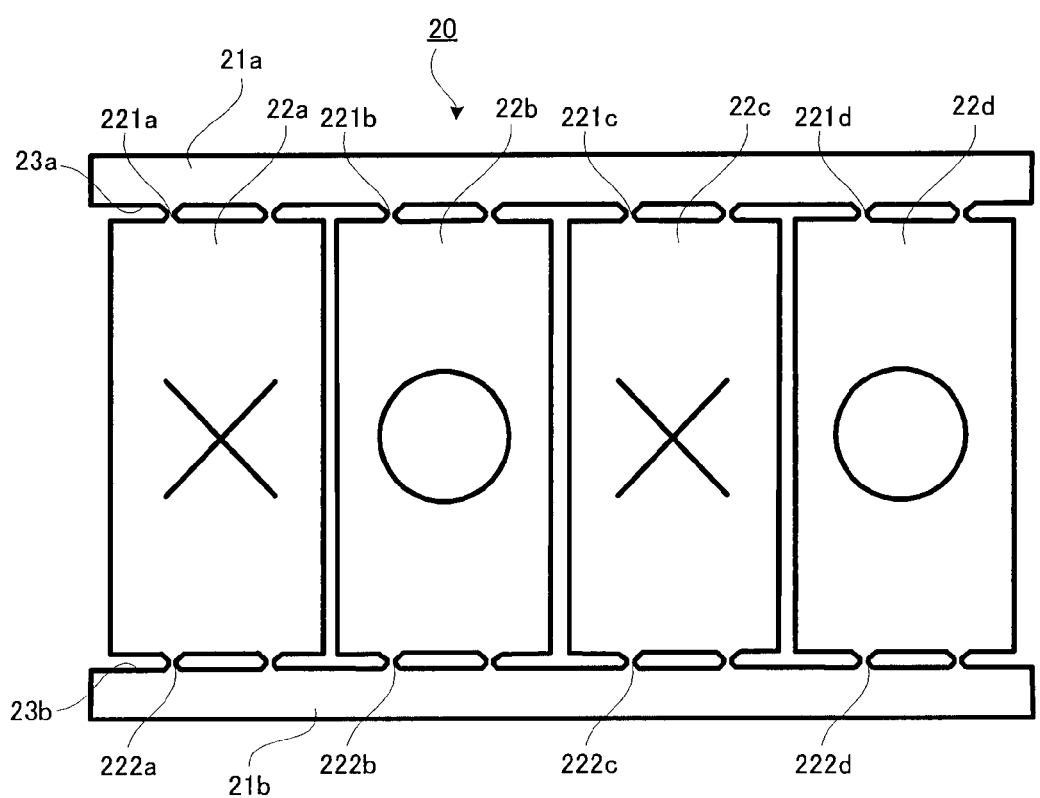
FIG. 7 is a diagram showing another multi-piece board (second board)

In the next step S14 (FIG. 3), the worker prepares another multi-piece board 20 (second board), for example, as shown in FIG. 7. The multi-piece board 20 also has a structure similar to that of the multi-piece board 10. That is, the multi-piece board 20 has frames 21a and 21b, and pieces 22a, 22b, 22c and 22d. Slits 23a and 23b are formed between the frame 21a, 21b and the pieces 22a to 22d, excluding those portions of bridges 221a to 221d and 222a to 222d. The multi-piece board 20 may be fabricated on the same workpiece as the multi-piece board 10, or may be fabricated on a different workpiece.

In the embodiment, the multi-piece board 20 is the multi-piece board which is determined in the electrification test as containing both a defective piece and a good piece. In the example shown in FIG. 7, for example, the pieces 22a and 22c are defective pieces while the pieces 22b and 22d are good pieces.

Figure 9A:
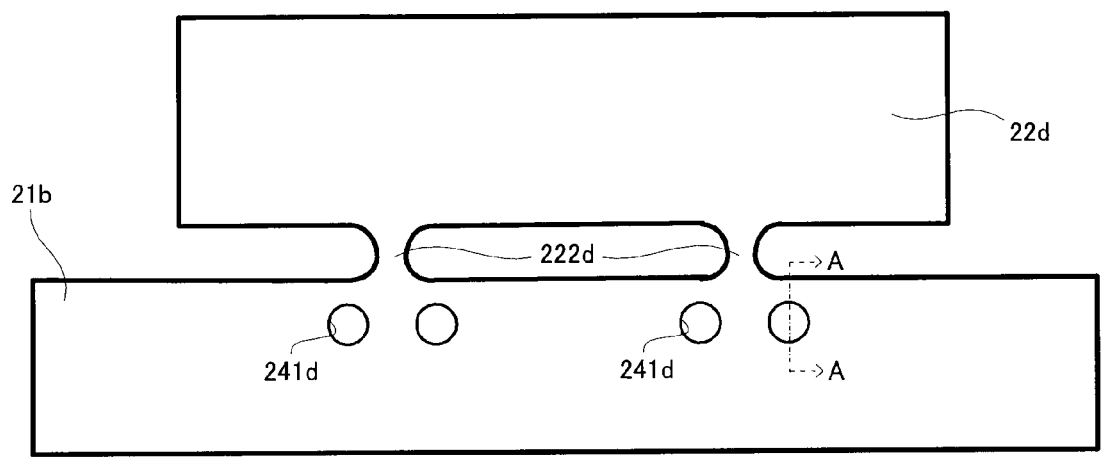
FIG. 9A is a diagram for explaining a step of forming an recess in the joint portion between a good piece and a frame.
Figure 9B:
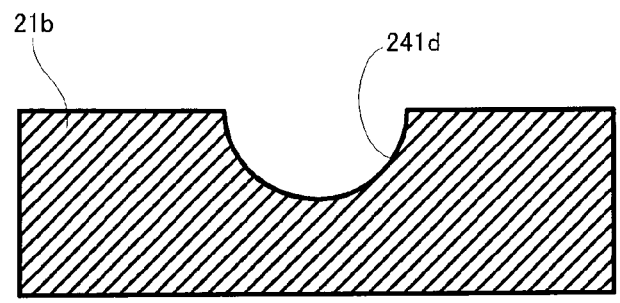
FIG. 9B is a cross-sectional view along line A-A in FIG. 9A.

Subsequently, the worker sets pins 41 in the frames 21a and 21b, and sets pins 42 in the piece 22d to secure the multi-piece board 20. Then, the alignment position of the piece 22d is scanned by the alignment router machine to acquire a geometric barycenter 43. Then, with the barycenter 43 being taken a reference or according to the distance from the barycenter 43, a predetermined number of non-penetrating recesses 241d (recess) dented with respect to the board surface are formed in each joint portion 24a, 24b between the piece 22d and the frame 21a, 21b by, for example, a router bit, a drill, a laser or the like as shown in FIG. 9A and FIG. 9B (cross-sectional view along line A-A in FIG. 9A). While FIGS. 9A and 9B show only the frame 21b side for the sake of descriptive convenience, the same is true of the frame 21a side.

Figure 8:
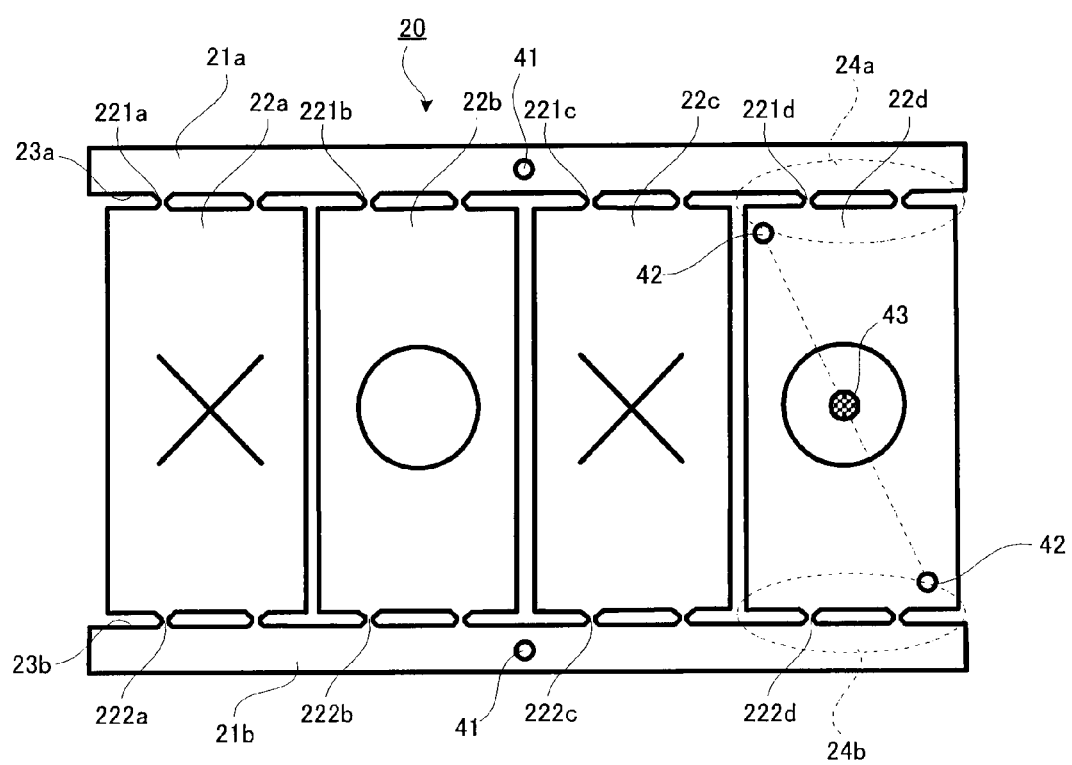
FIG. 8 is a diagram showing the multi-piece board (second board) secured by pins.
Figure 10A:
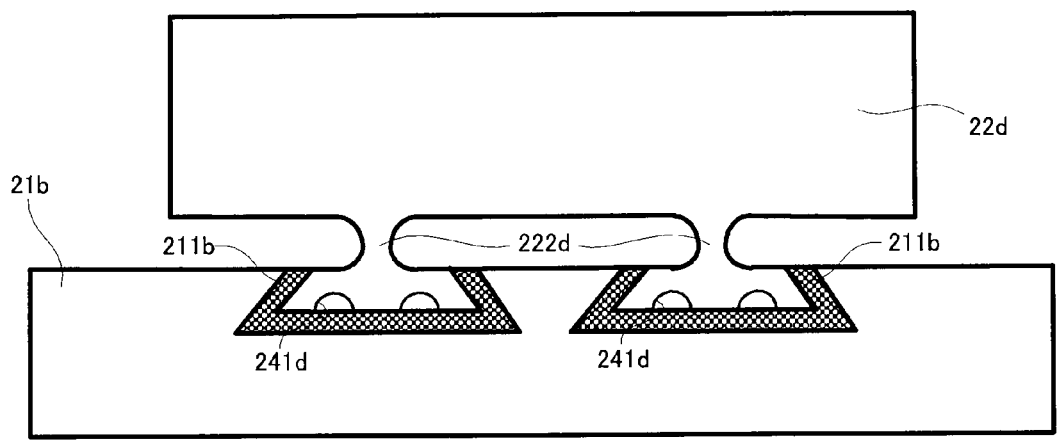
FIG. 10A is a diagram for explaining a step of forming a nick in the joint portion between a good piece and a frame.
Figure 10B:
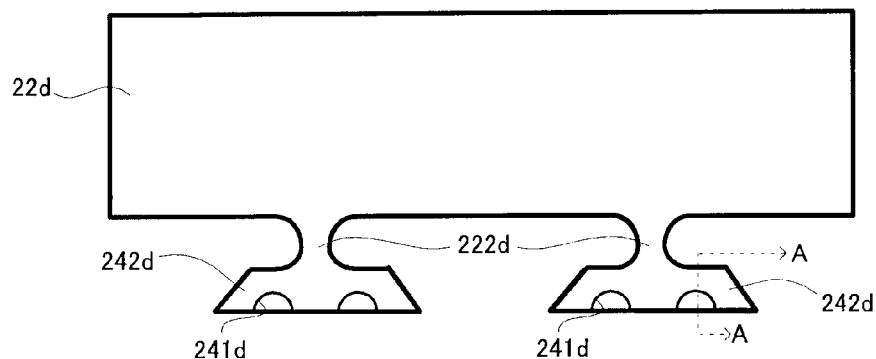
FIG. 10B is a diagram showing a good piece cut away from the frame.
Figure 10C:
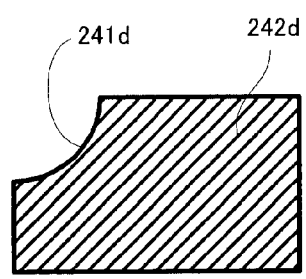
FIG. 10C is a cross-sectional view along line A-A in FIG. 10B.

Subsequently, the worker nicks the joint portions 24a, 24b (FIG. 8) using the alignment router. As shown in FIG. 10A, the cutting with the alignment router takes away the material of a nick portion 211b. Because the frames 21a, 21b are not used later, the worker finishes the multi-piece board 20 to predetermined outer sizes (design values) with the cutting with higher priority given to the piece 22d (good piece). Then, the worker separates the piece 22d from the frames 21a, 21b. As a result, as shown in FIG. 10B, projections 242d (fitting claws) connected to the bridge 222d and protruding toward the frame 21a, 21b are formed in the joint portion 24a, 24b of the piece 22d. The projection 242d has a trapezoidal shape spreading toward the frame 21a, 21b from the piece 22d side, and is to be fitted in the recess 142c of the multi-piece board 10. The projections 242d are formed at the piece 22d at, for example, four locations. As shown in FIG. 10C (cross-sectional view along line A-A in FIG. 10B), a predetermined of quarter-spherical recesses 241d, for example, two recesses 241d per projection 242d, remain at the tip portion of each projection 242d. The recess 241d has a shape symmetrical to the shape of the recess 141c. While FIGS. 10A to 10C show only the frame 21b side for the sake of descriptive convenience, the same is true of the frame 21a side.

Figure 11:
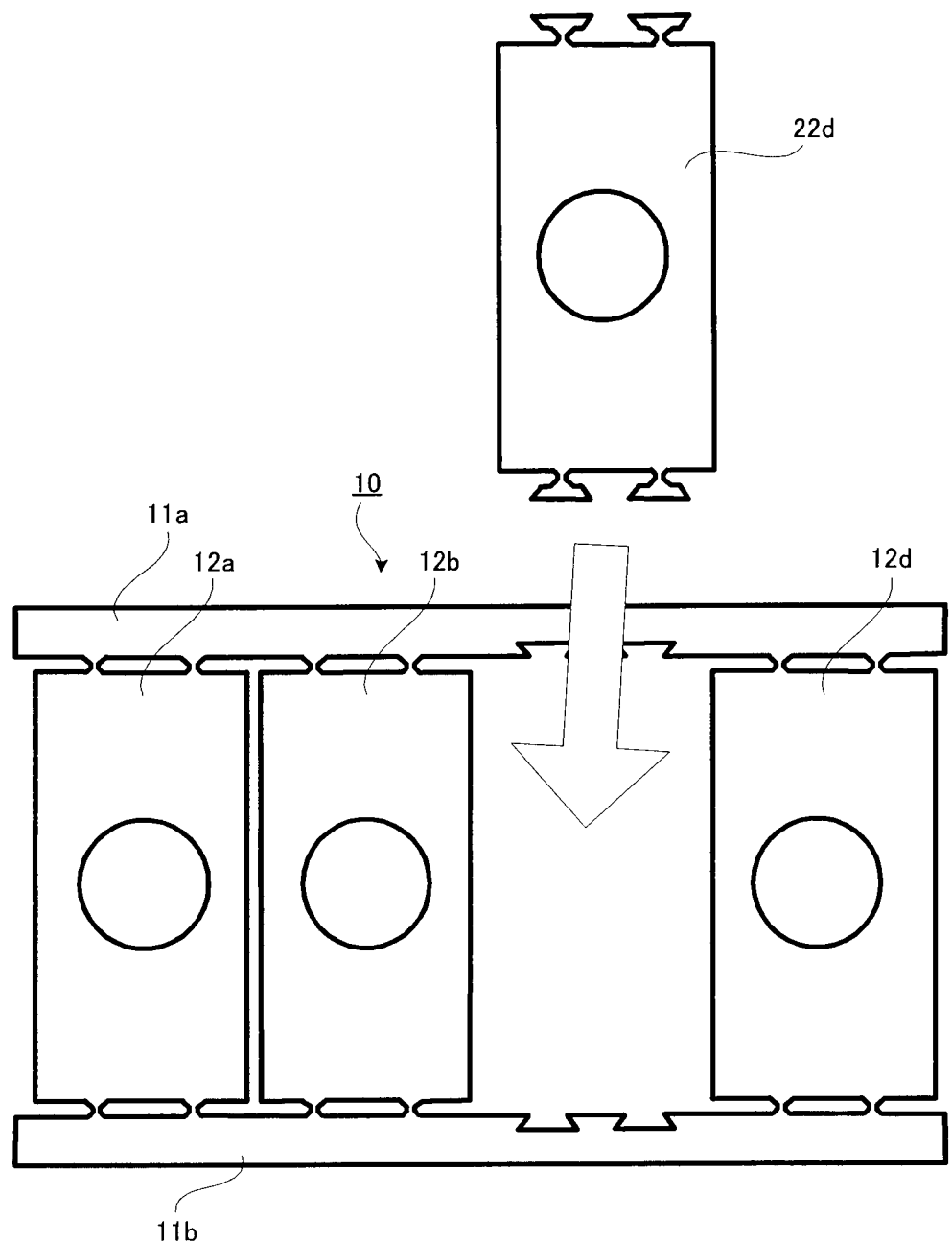
FIG. 11 is a diagram for explaining a step of fitting a good piece in the multi-piece board (first board)
Figure 12:
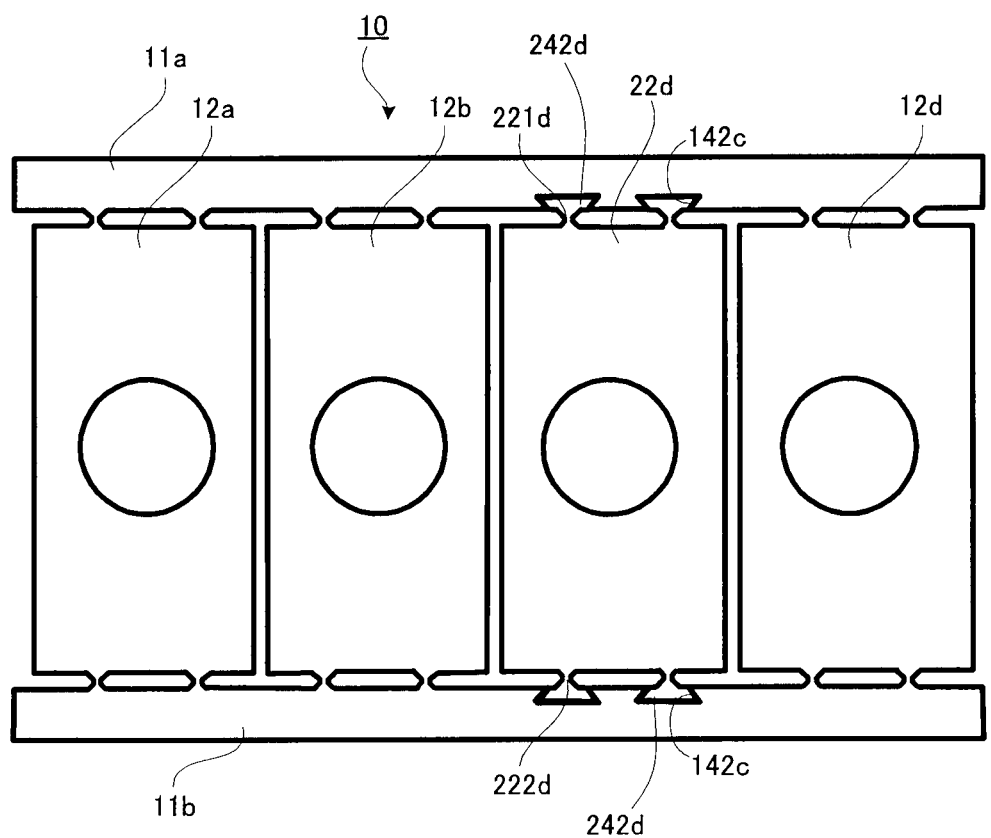
FIG. 12 is a diagram showing the multi-piece board (first board) after the good piece is fitted therein.
Figure 13A:
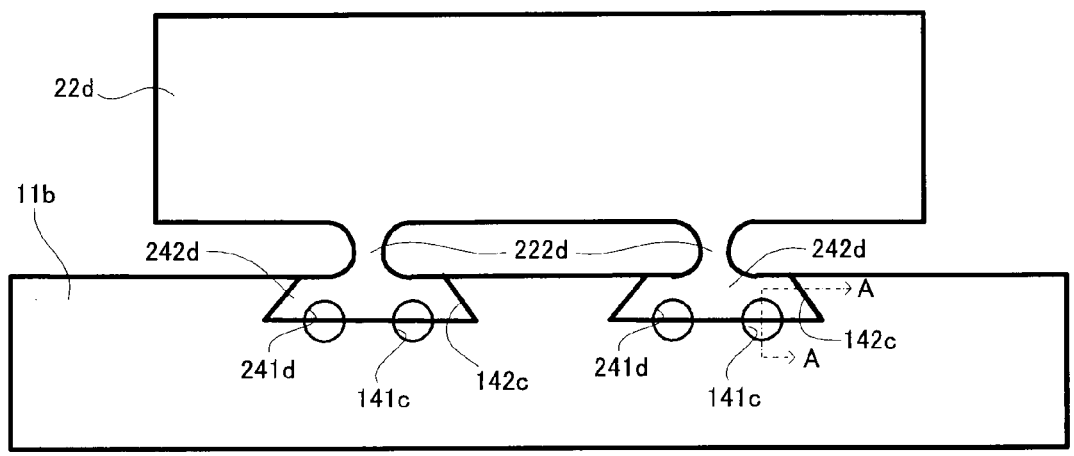
FIG. 13A is a partly enlarged diagram of the multi-piece board in FIG. 12.
Figure 13B:
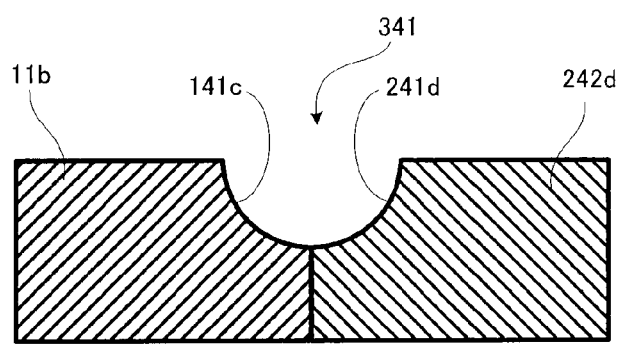
FIG. 13B is a cross-sectional view along line A-A in FIG. 13A.

In the next step S15 (FIG. 3), as shown in FIG. 11, the worker inserts the piece 22d (good piece) of the multi-piece board 20 in that portion of the multi-piece board 10 where the piece 12c (defective piece) has been removed. Specifically, as shown in FIG. 12, the worker manually fits the projections 242d of the piece 22d into the associated recesses 142c of the frames 11a, 11b. At this time, as shown in FIG. 13A and FIG. 13B (cross-sectional view along line A-A in FIG. 13A), the multi-piece board 10 and the piece 22d are positioned in such a way that the recesses 141c and the recesses 241d are butted against each other. The butt jointing of the recesses 141c and the recesses 241d forms hemispherical recesses 341 (recess). The friction force between the recesses 142c and the projections 242d maintains the positional relationship after the fitting.

Figure 14A:
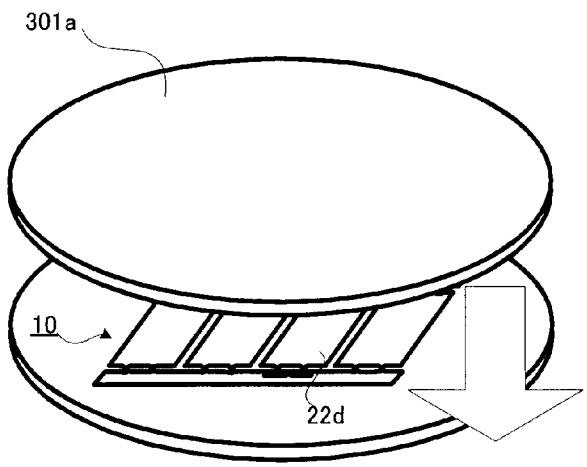
FIG. 14A is a diagram for explaining a step of flattening the joint portion between a frame and a good piece.
Figure 14B:
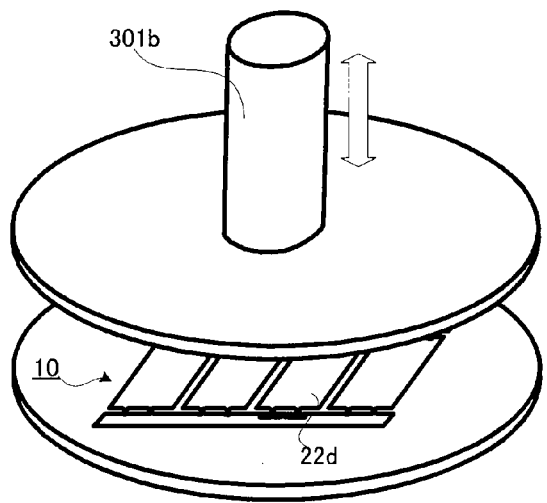
FIG. 14B is a diagram showing another example of the flattening step.
Figure 14C:
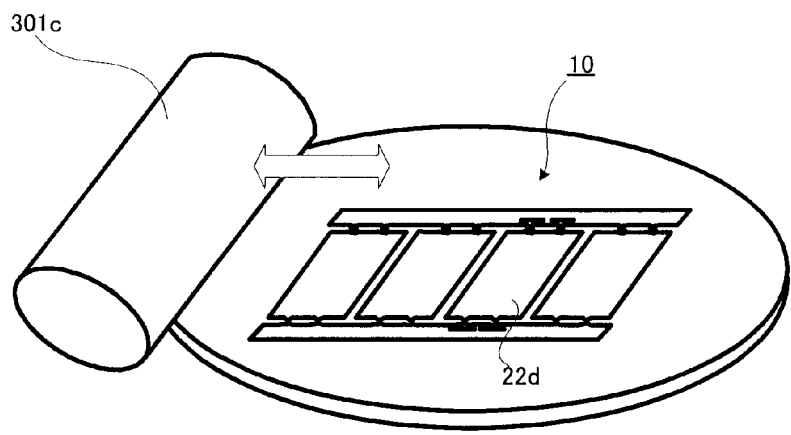
FIG. 14C is a diagram showing a further example of the flattening step.

In the next step S16 (FIG. 3), as shown in FIG. 14A, the worker presses the multi-piece board 10 with, for example, a manual pressing machine 301a to flatten the board. Particularly, the joint portions between the frames 11a, 11b and the piece 22d are flattened. Flattening means is optional. For example, flattening may be carried out using an automatic pressing machine 301b shown in FIG. 14B or a roller pressing machine 301c shown in FIG. 14C. Carrying out the flattening process using the automatic pressing machine 301b or the roller pressing machine 301c brings about an effect of improving the workability.

In the next step S17 (FIG. 3), as shown in FIG. 15, the worker checks the degree of flatness of the board using a laser displacement meter 302. In the next step S18, it is determined whether the degree of flatness is adequate or not. When it is determined in step S18 that the degree of flatness is not adequate, the flow returns to step S16 to carry out pressing again.

Figure 16:
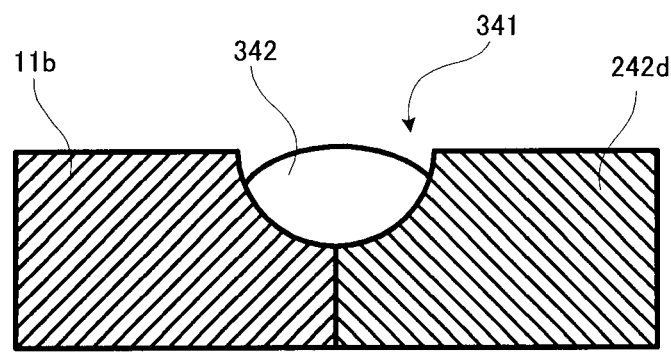
FIG. 16 is a diagram for explaining a step of filling an adhesive.

When it is determined in step S18 that the degree of flatness is adequate, in step S19 (FIG. 3), the worker fills a UV curing adhesive 342 of a resin in the recesses 341 as shown in FIG. 16. The UV curing adhesive 342 is filled in the gaps (connected portions) between the frames 11a, 11b and the piece 22d through the recesses 341.

Figure 17:
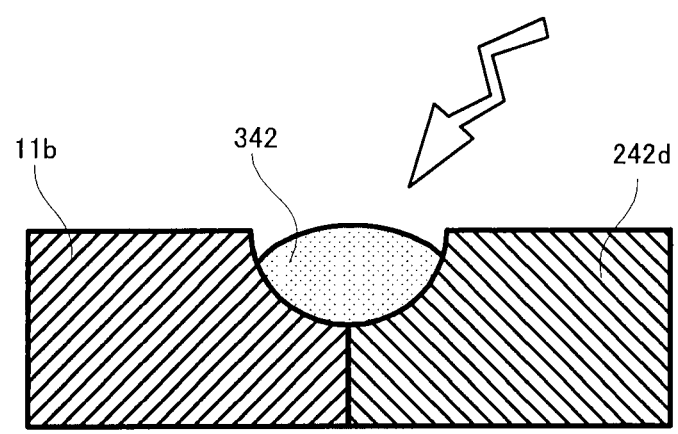
FIG. 17 is a diagram for explaining a step of curing the adhesive.

In the next step S20 (FIG. 3), as shown in FIG. 17, the worker illuminates the UV curing adhesive 342 with a spot of ultraviolet rays to cure the UV curing adhesive 342. The curing adheres the frames 11a, 11b and the piece 22d (good piece) of the multi-piece board 10 together. Then, the piece 22d is fixed to the frames 11a, 11b.

Subsequently, the flow returns to step S11 to execute the electrification test again. When it is determined in the electrification test that every piece is a good piece, the sequence of processes in FIG. 3 is terminated and the flow goes to a subsequent process such as an assembling process. When it is determined that any one of the pieces is a defective piece, on the other hand, the flow goes to step S13 to replace the defective piece with a good one and execute the foregoing sequence of processes again.

Through the sequence of processes, a so-called jigsaw board having a collection of good pieces only is formed. When the multi-piece board contains a defective piece, the multi-piece board can be repaired by replacing the defective piece with a good piece. With such repair, disposal of the whole multi-piece board can be avoided when the multi-piece board becomes partly defective, so that other good pieces will not be wasted. This can therefore improve the yield and the number of yielded products.

The above-described fabrication method needs no tape or the like for temporal attachment for the temporal attachment is achieved by fitting the projections 242d of the piece 22d (good piece) into the associated recesses 142c of the frames 11a, 11b. Therefore, a tape adhering process is unnecessary. This can reduce the fabrication cost. The projections 242d and the recesses 142c can be connected together by frictional force merely by fitting the projections 242d into the recesses 142c. However, the frictional force alone does not provide strong adhesion, resulting in a low reliability. According to the foregoing fabrication method, unlike the use of the frictional force, the UV curing adhesive 342 is filled in the recesses 341 to adhere the recesses 142c and the projections 242d. This increases the strength of connection between the frames 11a, 11b and good pieces. As the frames 11a, 11b and good pieces are firmly fixed, the positional precision of both after adhesion is high.

According to the foregoing fabrication method, the UV curing adhesive 342 is filled in the non-penetrating recesses 341. As a result, the UV curing adhesive 342 is filled in the gaps (connected portions) between the frames 11a, 11b and the good piece more surely as compared with the case of through holes. Accordingly, the frames 11a, 11b and good pieces are adhered more surely by the UV curing adhesive 342. The non-penetrating recesses 341 provides larger contact areas between the frames 11a, 11b and a good piece as compared with the case of the through holes. Therefore, the frictional force between the frames 11a, 11b and the good piece becomes larger. Therefore, the adhesive as well as the frictional force provides a larger strength of connection between the frames 11a, 11b and the good piece. This suppresses deciduousness of cut-and-pasted good pieces, and facilitates handling in subsequent processes or the like.

According to the foregoing fabrication method, the joint portions 14a, 14b between the piece 12c and the frames 11a, 11b are nicked by the alignment router. The piece 22d (good piece) is cut away from the multi-piece board 20 by the alignment router. Accordingly, the precision of the sizes of the recesses 142c of the frames 11a, 11b and the projections 242d of the piece 22d is high. The alignment router can ensure working of the outer shape on the order of an error of, for example, ±20 µm. The improvement on the size precision of the joint portions also improves the precision of alignment between the frames 11a, 11b and good pieces after connection.

According to the foregoing fabrication method, after a good piece is fitted and before the UV curing adhesive 342 is filled, the joint portions between the frames 11a, 11b and the good piece are flattened. This improves the precision of the height positions of the fitted and replaced part (good piece) and the other part. Accordingly, at the time of mounting electronic parts on pieces each comprising a printed wiring board, it is possible to fabricate good mounted boards with few mounting defects and with a high yield.

According to the foregoing fabrication method, the UV curing adhesive 342 is filled in the recesses 341. Unlike a heat-hardening adhesive, the UV curing adhesive does not need a heat treatment. The UV curing adhesive can therefore suppress a change (cure shrinkage or the like) in the shape of the board originating from a temperature change. Because a photo-curing adhesive does not normally need a heat treatment, a photo-curing adhesive other than the UV curing adhesive may be used. The photo-curing adhesive is an adhesive which is cured by irradiation of electromagnetic waves, such as ultraviolet rays or visible light. Further, an energy irradiation type or two-component type acrylic adhesive or the like, for example, is effective. As the acrylic adhesive does not need a heat treatment too, a change (cure shrinkage or the like) in the shape of the board can be suppressed.

According to the foregoing fabrication method, a good piece is cut away from the multi-piece board 20, which contains a defective piece and good pieces, to replace a defective piece of the multi-piece board 10. This makes it possible to improve the yield and the number of yielded products by effectively using the multi-piece board 20 which would otherwise have been discarded.

According to the fabrication method, as described above, a high strength of connection can be provided between the frames and pieces through a simple process.

Although the multi-piece board and the fabrication method therefore according to one embodiment of the invention have been described above, the invention is not limited to the embodiment.

While the joint portions 14a, 14b are nicked by the alignment router to cut away the piece 22d (good piece) by the alignment router according to the embodiment, a worker may use another means in place of the alignment router. For example, an ordinary router bit (router without an alignment capability), a laser or the like may be used according to the use or the like.

Figure 18A:
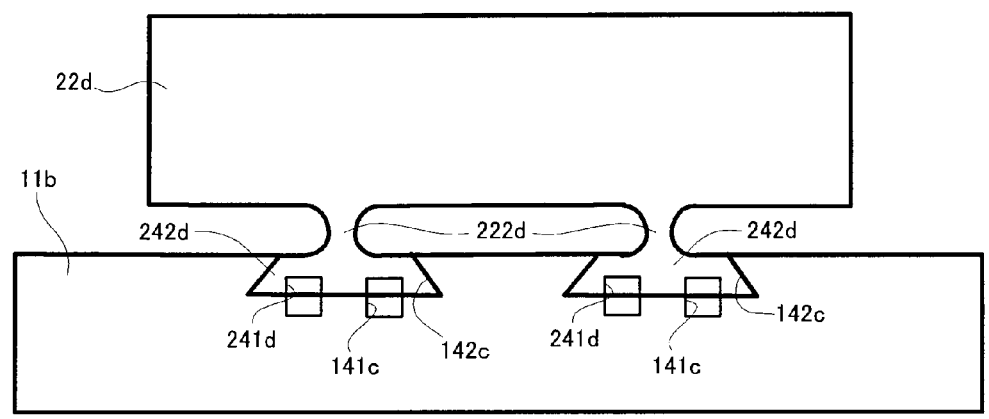
FIG. 18A is a diagram showing another example of the shape of an recess in which the adhesive is to be filled.
Figure 18B:
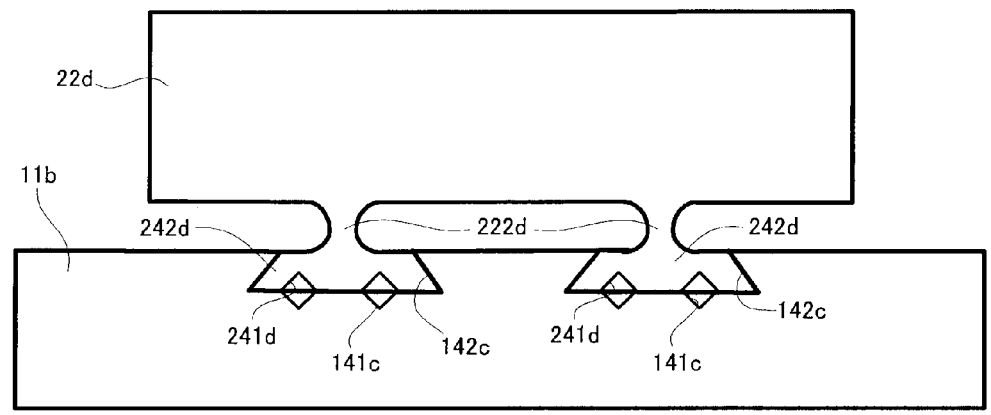
FIG. 18B is a diagram showing a further example of the shape of an recess in which the adhesive is to be filled.
Figure 19A:
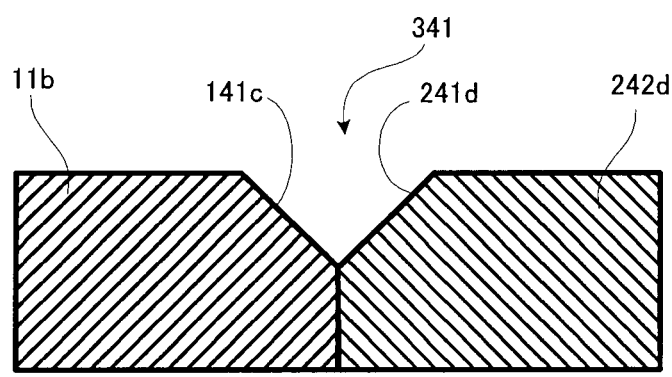
FIG. 19A is a diagram showing a still further example of the shape of an recess in which the adhesive is to be filled.
Figure 19B:
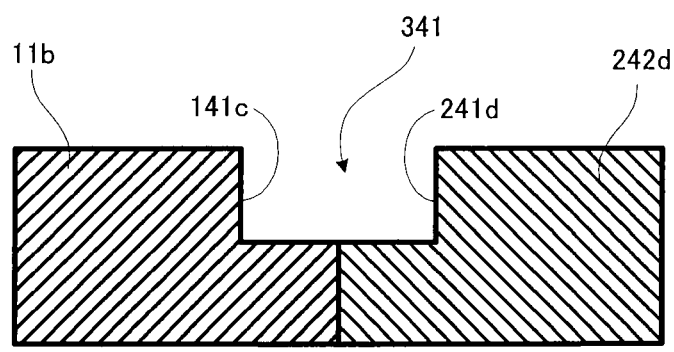
FIG. 19B is a diagram showing a yet still further example of the shape of an recess in which the adhesive is to be filled.

Although the recesses 341 are formed hemispherically according to the embodiment, the recesses 341 may take another shape. As shown in FIGS. 18A and 18B (which correspond to FIG. 13A), for example, the planar shape of the recesses 341 may be a quadrate parallel or inclined to the frames. As shown in FIGS. 19A and 19B (which correspond to FIG. 13B), the cross-sectional shape of the recesses 341 may be a triangle or quadrate.

Figure 20A:
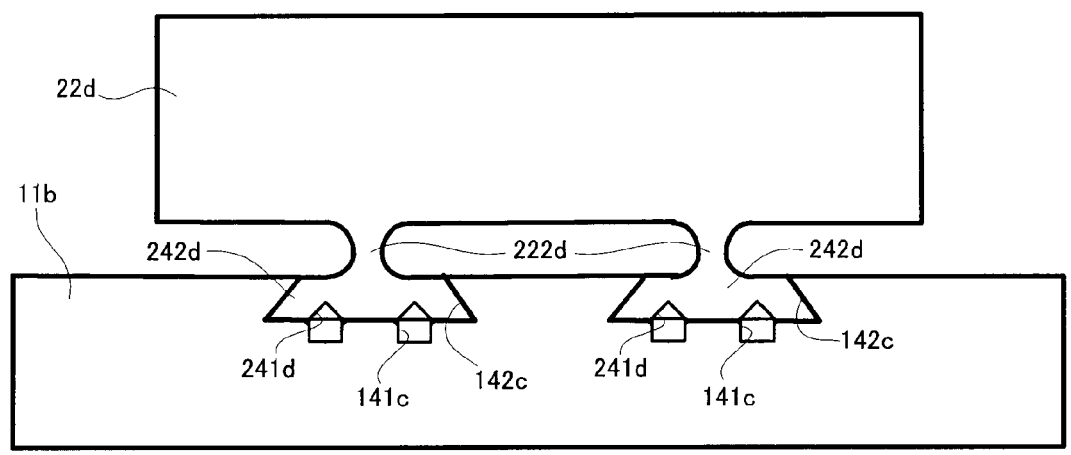
FIG. 20A is a diagram showing a yet still further example of the shape of an recess in which the adhesive is to be filled.
Figure 20B:
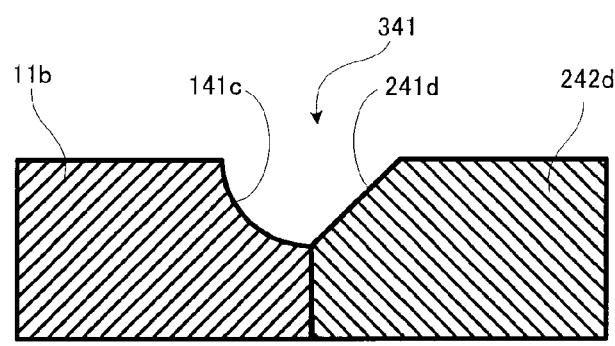
FIG. 20B is a diagram showing a yet still further example of the shape of an recess in which the adhesive is to be filled.

Although the recesses 141c and the recesses 241d have symmetrical shapes according to the embodiment, both recesses may have asymmetrical shapes as shown in FIG. 20A (corresponding to FIG. 13A) or FIG. 20B (corresponding to FIG. 13B), for example.

Figure 21:
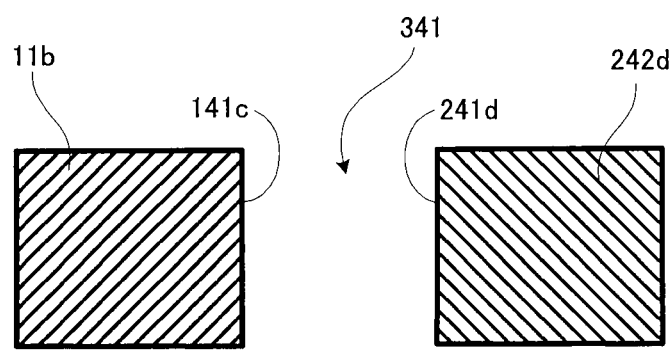
FIG. 21 is a diagram showing a yet still further example of the shape of an recess in which the adhesive is to be filled.

Although the recesses 341 are non-penetrating recesses according to the embodiment, the recesses may be of a penetrating type as shown in FIG. 21 (corresponding to FIG. 13B), for example. In this case, multi-boards can be placed one another at the time of forming through holes, thus bringing about an effect of improving the production capacity.

Although the recesses 142c (claw receiving portions) and the projections 242d (fitting claws) are formed at four locations of the frame or a good piece, the number of the fitting claws and the number of the claw receiving portions are optional. The larger the number of the fitting claws and the number of the claw receiving portions become, the stronger the fixation of good pieces becomes while the production becomes more difficult.

An adhesive other than a photo-curing adhesive or an acrylic adhesive may be used. For example, a heat-hardening adhesive or the like can be used. It is to be noted however that the heat-hardening adhesive may cause a change in the shape of the board originating from a temperature change while providing a high adhesion strength.

Two or more kinds of adhesives may be used. For example, after adhesion with a photo-curing adhesive or an acrylic adhesive (temporal attachment), a heat-hardening adhesive may be used for reinforcement.

Figure 22A:
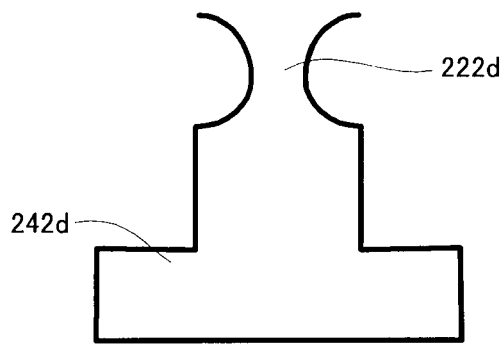
FIG. 22A is a diagram showing another example of the shape of a fitting portion.
Figure 22B:
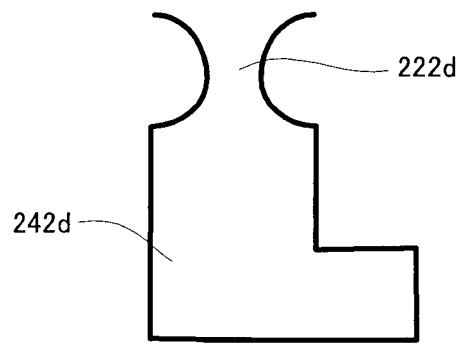
FIG. 22B is a diagram showing a further example of the shape of a fitting portion.
Figure 22C:
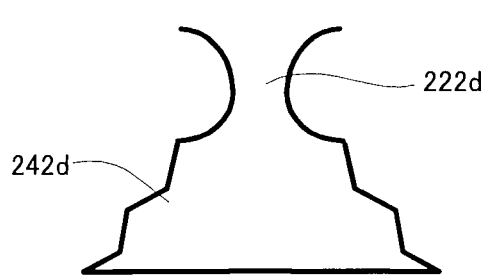
FIG. 22C is a diagram showing a still further example of the shape of a fitting portion.

The shapes of the recesses 142c (claw receiving portions) and the projections 242d (fitting claws) are not limited to trapezoidal shapes. As shown in FIG. 22A or FIG. 22B (both being partly enlarged views of FIG. 10B), for example, the projections 242d may be formed in a T shape or an L shape. To increase the contact area of the recess 142c, the sides of the projection 242d may be formed to have a zigzag pattern, for example, as shown in FIG. 22C (partly enlarged view of FIG. 10B). The shape of the fitting portions is basically optional. It is however preferable that the fitting portion should have such a shape that when a good piece is stretched in parallel to the major surface of the board, the fitting portion is caught at the frame so that the good piece does not come off the frames.

Although the claw receiving portions are formed at the frames and the fitting claws are formed at a good piece in the embodiment, the fitting claws may be formed at the frames and the claw receiving portions may be formed at a good piece vice versa.

Although a good piece is cut away from the multi-piece board 20 in the embodiment, a good piece may be cut away from another multi-piece board. For example, a good piece may be cut away from a multi-piece board which does not have frames and have only pieces.

Figure 3:
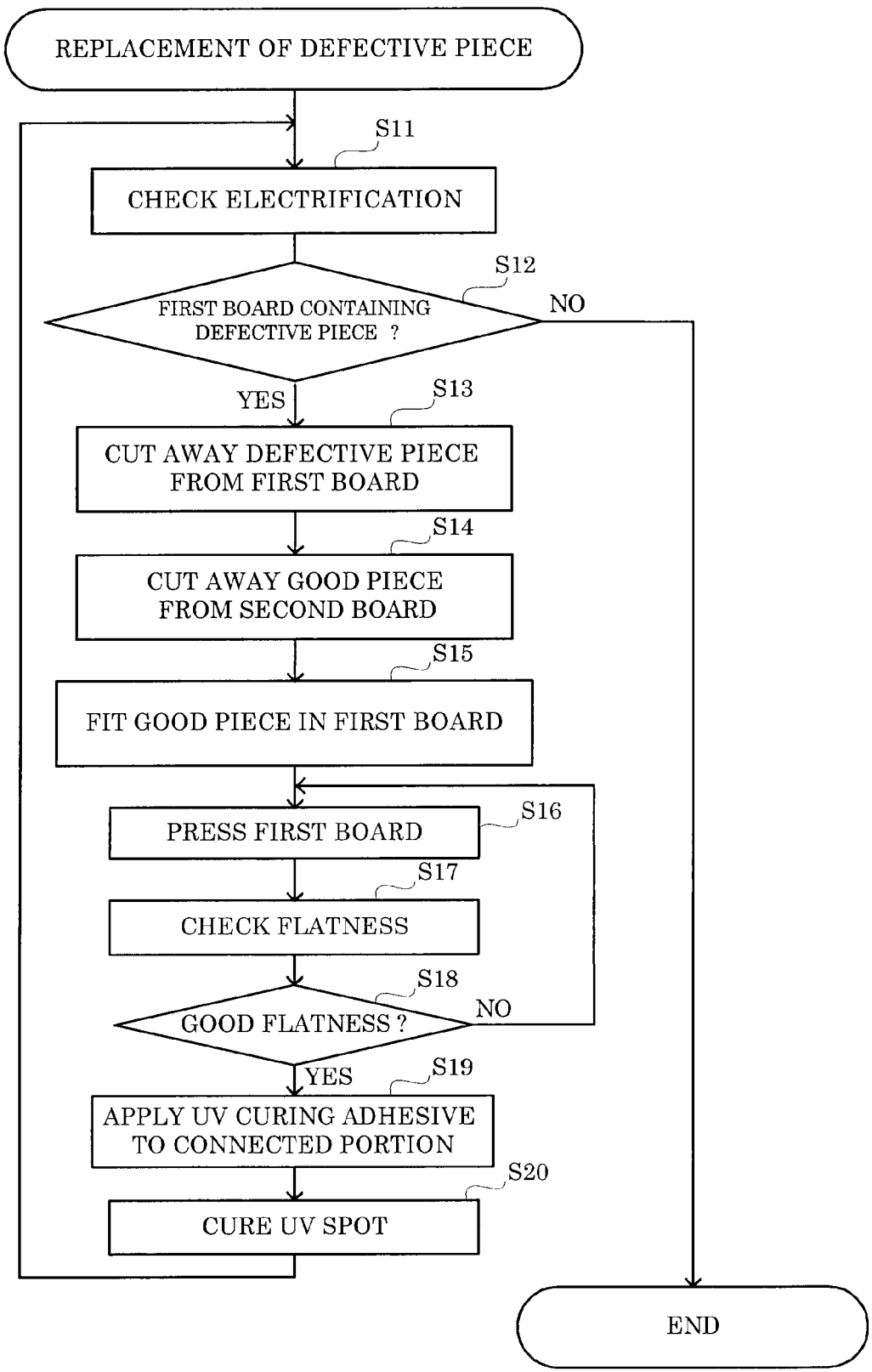
FIG. 3 is a flowchart illustrating procedures of a method of fabricating the multi-piece board according to the embodiment of the invention, particularly procedures of a process of replacing a defective piece.

The order of the processes of the embodiment is not limited to the one illustrated in the flowchart in FIG. 3, and can be changed arbitrarily without departing from the scope and spirit of the invention. Unnecessary processes may be omitted according to the usage. While the recesses 141c are formed before cutting away a defective piece from the multi-piece board 10 according to the embodiment, for example, the recesses 141c may be formed after cutting away a defective piece from the multi-piece board 10. Likewise, the recesses 241d may be formed after cutting away a good piece from the multi-piece board 20. The process of checking the degree of flatness can be omitted, for example, when severe flatness is not demanded.

The materials and sizes of the individual layers, the number of the layers, and so forth can be changed arbitrarily according to the embodiment.

The multi-piece board described in Unexamined Japanese Patent Application KOKAI Publication No. H01-48489 has a frame and pieces connected together only by fitting of recesses and projections. Therefore, the adhesive strength at the joint portion is weak. The multi-piece board described in Unexamined Japanese Patent Application KOKAI Publication No. 2002-43702 has a frame and pieces connected together by an adhesive alone. Therefore, the cure shrinkage of the adhesive may degrade the positional precision of the pieces. The multi-piece board described in Unexamined Japanese Patent Application KOKAI Publication No. 2002-232089 has a joint portion covered with an overlying layer. This is considered to reinforce the joint portion. Because the specifications of boards differ from one product to another, however, it is considered that this scheme complicates the reinforcement work (design, fabrication processes, etc.).

The present invention has been made in consideration of the above situations, and it is an object of the invention to provide, in a simple process, a multi-piece board which can have a high connection strength at the joint portion between a frame and a piece and has a high electronic-part mounting reliability, and a method of fabricating the same.

Obviously, numerous modifications and variations of the present invention are possible in light of the above teachings. It is therefore to be understood that within the scope of the appended claims, the invention may be practiced otherwise than as specifically described herein.

What is claimed is:

1. A fabrication method for a multi-piece board, comprising:
    forming a first recess in a joint portion connecting a defective piece and a frame of a first board;
    separating the defective piece from the frame such that a first fitting portion having the first recess is formed in the frame of the first board;
    forming a second recess in a joint portion connecting a defect-free piece and a frame of a second board;
    cutting out the defect-free piece from the frame of the second board such that the defect-free piece having a second fitting portion including the second recess is separated from the second board;
    positioning the defect-free piece to the frame of the first board such that the second fitting portion of the defect-free piece fits in the first fitting portion in the frame of the first board and that the second recess of the defect-free piece and the first recess in the frame of the first board form a third recess;
    filling an adhesive material in the third recess formed of the first recess and the second recess; and
    adhering the frame of the first board and the defect-free piece,
    wherein the defective piece comprises a printed wiring board, and the defect-free piece comprises a printed wiring board.

2. The fabrication method according to claim 1 further comprising:
    flattening a joint portion formed between the first fitting portion in the frame of the first board and the second fitting portion of the defect-free piece positioned to the frame of the first board.

3. The fabrication method according to claim 1, wherein the third recess formed of the first recess and the second recess is a non-penetrating recess formed in a joint portion formed between the first fitting portion in the frame of the first board and the second fitting portion of the defect-free piece positioned to the frame of the first board.

4. The fabrication method according to claim 1, wherein the second board is a multi-piece board including a defective piece and the defect-free piece.

5. The fabrication method according to claim 1, wherein the separating of the defective piece comprises cutting the joint portion connecting the defective piece and the frame of the first board by an alignment router.

6. The fabrication method according to claim 1, wherein the cutting of the defect-free piece comprises cutting the joint portion connecting the defect-free piece and the frame of the second board by an alignment router.

7. The fabrication method according to claim 1, wherein the adhesive material is a photo-curing adhesive material, and the adhering of the frame of the first board and the defect-free piece comprises curing the photo-curing adhesive material filled in the third recess.

8. The fabrication method according to claim 1, wherein the adhesive material is an acrylic adhesive material, and the adhering of the frame of the first board and the defect-free piece comprises curing the acrylic adhesive filled in the third recess.

9. The fabrication method according to claim 2, wherein the third recess formed of the first recess and the second recess is a non-penetrating recess formed in a joint portion formed between the first fitting portion in the frame of the first board and the second fitting portion of the defect-free piece positioned to the frame of the first board.

10. The fabrication method according to claim 2, wherein the second board is a multi-piece board including a defective piece and the defect-free piece.

11. The fabrication method according to claim 2, wherein the separating of the defective piece comprises cutting the joint portion connecting the defective piece and the frame of the first board by an alignment router.

12. The fabrication method according to claim 2, wherein the cutting of the defect-free piece comprises cutting the joint portion connecting the defect-free piece and the frame of the second board by an alignment router.

13. The fabrication method according to claim 2, wherein the adhesive material is a photo-curing adhesive material, and the adhering of the frame of the first board and the defect-free piece comprises curing the photo-curing adhesive material filled in the third recess.

14. The fabrication method according to claim 2, wherein the adhesive material is an acrylic adhesive material, and the adhering of the frame of the first board and the defect-free piece comprises curing the acrylic adhesive filled in the third recess.

15. The fabrication method according to claim 1, wherein the separating of the defective piece comprises cutting the joint portion connecting the defective piece and the frame of the first board by an alignment router, and the cutting of the defect-free piece comprises cutting the joint portion connecting the defect-free piece and the frame of the second board by an alignment router.

16. The fabrication method according to claim 1, wherein the positioning of the defect-free piece to the frame of the first board comprises butt jointing the second recess of the defect-free piece and the first recess in the frame of the first board such that the third recess is formed.

17. The fabrication method according to claim 1, wherein the positioning of the defect-free piece to the frame of the first board comprises butt jointing the second recess of the defect-free piece and the first recess in the frame of the first board such that the third recess having a hemispherical shape is formed.

18. The fabrication method according to claim 1, wherein the positioning of the defect-free piece to the frame of the first board comprises fitting the second fitting portion of the defect-free piece into the first fitting portion in the frame of the first board such that friction force between the second fitting portion and the first fitting portion maintains positional relationship between the second fitting portion and the first fitting portion.

19. The fabrication method according to claim 1, wherein the first fitting portion in the frame of the first board has a recess shape configured to receive the second fitting portion of the defect-free piece, and the second fitting portion of the defect-free piece has a projection shape configured to fit into the recess shape of the first fitting portion in the frame of the first board.

20. The fabrication method according to claim 1, wherein the first fitting portion in the frame of the first board has a recess shape configured to receive the second fitting portion of the defect-free piece, the second fitting portion of the defect-free piece has a projection shape configured to fit into the recess shape of the first fitting portion in the frame of the first board, and the positioning of the defect-free piece to the frame of the first board comprises fitting the second fitting portion of the defect-free piece into the first fitting portion in the frame of the first board such that friction force between the second fitting portion and the first fitting portion maintains positional relationship between the second fitting portion and the first fitting portion.

* * * * *